(12) United States Patent
Kawai et al.

(10) Patent No.: US 8,216,929 B2
(45) Date of Patent: Jul. 10, 2012

(54) METHOD OF MANUFACTURING SILICON CARBIDE SEMICONDUCTOR DEVICE

(75) Inventors: Jun Kawai, Anjo (JP); Kazuhiro Tsuruta, Nishio (JP)

(73) Assignee: DENSO CORPORATION, Kariya (JP)

( * ) Notice: Subject to any disclaimer, the term of this patent is extended or adjusted under 35 U.S.C. 154(b) by 29 days.

(21) Appl. No.: 12/923,205

(22) Filed: Sep. 9, 2010

(65) Prior Publication Data

US 2011/0092063 A1   Apr. 21, 2011

(30) Foreign Application Priority Data

Oct. 20, 2009   (JP) ................. 2009-241612

(51) Int. Cl.
*H01L 21/283* (2006.01)
(52) U.S. Cl. ................. 438/602; 257/E21.062
(58) Field of Classification Search .......... None
See application file for complete search history.

(56) References Cited

U.S. PATENT DOCUMENTS
2008/0145987 A1   6/2008   Shima

FOREIGN PATENT DOCUMENTS

| | | |
|---|---|---|
| JP | A-2002-289550 | 10/2002 |
| JP | A-2004-158702 | 6/2004 |
| JP | A-2006-41248 | 2/2006 |
| JP | A-2008-135611 | 6/2008 |

OTHER PUBLICATIONS

Imai et al. "N-type and p-type ohmic contacts for 4H-SiC using Ni salicide process" *Proceedings of the 51st Meeting, the Japan Society of Applied Physics and Related Societies* (Mar. 2004, Tokyo University of Technology), 29p-ZM-14.

*Primary Examiner* — Seahvosh Nikmanesh
(74) *Attorney, Agent, or Firm* — Posz Law Group, PLC

(57) ABSTRACT

In a method of manufacturing a silicon carbide semiconductor device, a semiconductor substrate made of silicon carbide and having first and second opposing surfaces is prepared. The second surface of the semiconductor substrate is processed so that a surface roughness of the second surface is less than or equal to 10 nm and a value of (100%-reflectance-transmittance) at a wavelength of a laser light is greater than or equal to 80%. A metal layer is formed on the second surface of the semiconductor substrate after the processing the second surface. The metal layer is irradiated with the laser light and thereby an ohmic electrode is formed on the second surface.

7 Claims, 5 Drawing Sheets

METHOD OF MANUFACTURING SILICON CARBIDE SEMICONDUCTOR DEVICE

CROSS REFERENCE TO RELATED APPLICATIONS

The present application is based on and claims priority to Japanese Patent Application No. 2009-241612 filed on Oct. 20, 2009, the contents of which are incorporated in their entirety herein by reference.

BACKGROUND OF THE INVENTION

1. Field of the Invention

The present invention relates to a method of manufacturing a silicon carbide semiconductor device including an ohmic electrode.

2. Description of the Related Art

When a vertical power device is formed in a silicon carbide (SiC) substrate and when an electrode for coupling the vertical power device and an electric circuit, in particular, a drain electrode is formed, an ohmic electrode that reduces a contact resistance between the SiC substrate and the drain electrode can be formed.

A method of manufacturing an SiC semiconductor device including an ohmic electrode is disclosed, for example, in Imai et al., "N-type and p-type ohmic contacts for 4H-SiC using Ni salicide process", 29p-ZM-14, proceedings of the 51st Meeting, the Japan Society of Applied Physics and Related Societies, Mar. 28, 2004. In the manufacturing method, a nickel (Ni) silicide layer is formed on the SiC substrate by a silicide process in order to form an ohmic electrode that maintains a low resistance contact with both of an n type SiC and a p type SiC. The silicide process includes performing vacuum evaporation of Ni on the SiC substrate and then performing a thermal treatment of the SiC substrate.

JP-A-2004-158702 discloses a method including forming an impurity-doped layer on an SiC substrate, forming a metal thin layer on the impurity-doped layer, and irradiating the metal thin layer with a laser light to form an ohmic electrode.

Specifically, after an electrode is formed on a front surface of the SiC substrate, the electrode on the front surface is protected with a resin layer. Then, a thickness of the SiC substrate is reduced from a rear surface, and impurity ions are implanted into the rear surface of the SiC substrate. After activating the impurities by a high-temperature heat treatment, the metal thin layer as an electrode is formed on the rear surface of the SiC substrate. The metal thin layer is irradiated with the laser light, and thereby the ohmic electrode is formed.

JP-A-2006-41248 discloses a method of forming an ohmic electrode after forming a fine asperity on an exposed surface of an SiC substrate by polishing or irradiating with a laser light.

Specifically, after an electrode is formed on a front surface of the SiC substrate, the electrode on the front surface is protected with a resin layer. A thickness of the SiC substrate is reduced from a rear surface, and the rear surface of the SiC substrate is treated with a polishing process or a laser irradiation so that the fine asperity is formed on the rear surface. Then, a metal thin layer as an electrode is formed on the rear surface on which the fine asperity is formed.

In the method disclosed in JP-A-2006-41248, Ni is used as a material of the Ohmic electrode. Thus, a sintering over 800° C. is required for forming Ni silicide that is a compound of Ni and Si in SiC.

In the method disclosed in JP-A-2004-158702, an impurity-doped layer is formed on the rear surface of the SiC substrate before irradiating the rear surface with the laser light. In order to activate the impurities in the impurity-doped layer, a heat treatment of the SiC substrate at a relatively high temperature is required after forming, the impurity-doped layer. In an ion implantation method, a heat treatment of the SiC substrate is performed, for example, at a temperature from 1600° C. to 1700° C.

Thus, in the above-described methods, the electrode on the front surface of the SiC substrate may be damaged during the heat treatment, and various failures may occur in a device.

In a device in which electric current flows in a front-rear direction such as a vertical power device, it is preferred that a thickness of an SiC substrate is reduced for reducing an operation resistance. However, when the thickness of the SiC substrate is too small, it is difficult to perform a high-temperature heat treatment of the SiC substrate and to form an ohmic electrode on a rear surface of the SiC substrate.

As a method of activating an impurity-doped layer without a high-temperature heat treatment, JP-A-2002-289550 discloses a method of irradiating an SiC substrate with a laser light.

Specifically, an electrode is formed on a front surface of SiC substrate in which a vertical element is formed. Next, the front surface of the SiC substrate is protected with a resin film, and a thickness of the SiC substrate is reduced from a rear surface of the SiC substrate. Then, impurity ions are implanted into the rear surface of the SiC substrate, and the rear surface is irradiated with the laser light. After that, a metal thin layer is formed on the rear surface of the SiC substrate.

The method including the ion implanting process has difficulties that ion implanting process is expensive in addition to a fact that an ion implanting apparatus is expensive. Therefore, it is to be desired that an ohmic electrode is formed without an ion implanting process.

As a method not using an ion implanting process, JP-A-2008-135611 discloses a method of forming a metal layer on an SiC substrate and irradiating the SiC substrate with a laser light.

Specifically, a rear surface of the SiC substrate is polished to form an asperity having a surface roughness (Ra) of from 10 nm to 50 nm and the metal layer is formed on the rear surface. Then, the rear surface of the SiC substrate is irradiated with the laser light, and thereby an electrode is formed.

In the above-described method, it is difficult to perform a photo process due to the asperity. Furthermore, when a thickness of the SiC substrate is reduced, a crack may occur due to damage by polishing. Thus, it is to be desired that an ohmic electrode is formed without forming an asperity by polishing.

SUMMARY OF THE INVENTION

In view of the foregoing problems, it is an object of the present invention to provide a method of manufacturing a silicon carbide semiconductor device in which an ohmic electrode can be formed through a low-temperature process without using an impurity-doped layer and a polishing process.

In a method of manufacturing a silicon carbide semiconductor device according to a first aspect of the present invention, a semiconductor substrate made of silicon carbide and having a first surface and a second surface opposing the first surface is prepared. The second surface of the semiconductor substrate is processed so that a surface roughness of the second surface is less than or equal to 10 nm and a value of (100%-reflectance-transmittance) at a wavelength of a laser light is greater than or equal to 80%. A metal layer is formed on the second surface of the semiconductor substrate after the processing the second surface. The metal layer is irradiated with the laser light, and thereby an ohmic electrode is formed on the second surface.

In the method according to the first aspect, the ohmic electrode can be formed through a low-temperature process without using an impurity-doped layer and a polishing process.

In a method of manufacturing a silicon carbide semiconductor device according to a second aspect of the present invention, a semiconductor substrate made of silicon carbide and having a first surface and a second surface opposing the first surface is prepared. A metal layer is formed on the second surface of the semiconductor substrate. A surface of the metal layer is processed so that a value of (100%-reflectance-transmittance) at a wavelength of a laser light is greater than or equal to 80%. The metal layer is irradiated with the laser light after the processing the surface of the metal layer.

In the method according to the second aspect, the ohmic electrode can be formed through a low-temperature process without using an impurity-doped layer and a polishing process.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

Figure 1:
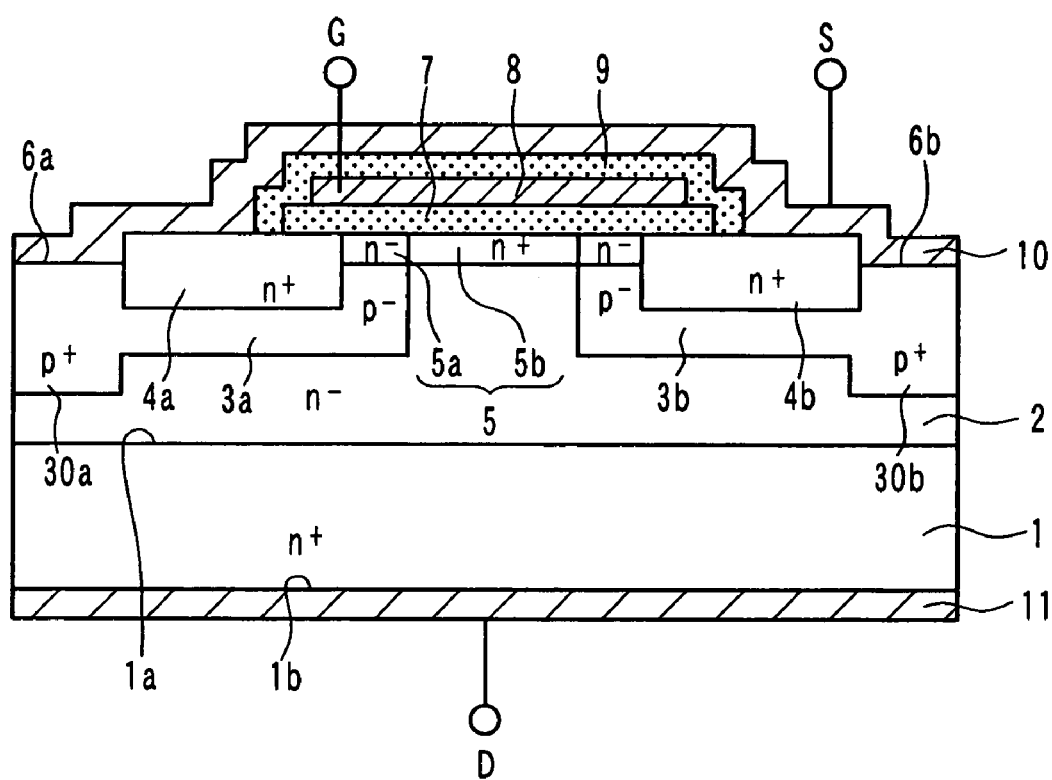
FIG. 1 is a cross-sectional view of a vertical power MOSFET according to a first embodiment of the present invention.

A vertical power metal-oxide semiconductor field-effect transistor (MOSFET) manufactured by a method according to a first embodiment of the present invention will be described with reference to FIG. 1. The vertical power MOSFET can be suitably used for, for example, an inverter.

The vertical power MOSFET includes an n+ type semiconductor substrate 1. The n+ type semiconductor substrate 1 has a front surface 1a and a rear surface 1b opposing the front surface 1a. The n+ type semiconductor substrate 1 is made of single crystal SiC. The n+ type semiconductor substrate 1 has a thickness of, for example, 350 µm. On the front surface 1a of the n+ type semiconductor substrate 1, an n− type epitaxial layer 2 is disposed. The n− type epitaxial layer 2 is made of SiC and has an impurity concentration lower than the n+ type semiconductor substrate 1.

At predetermined regions of a surface portion of the n− type epitaxial layer 2, a p− type base region 3a and a p− type base region 3b are disposed so as to be separated from each other. The p− type base region 3a includes a deep base layer 30a thicker than other portion of the p− type base region 3a. The p− type base region 3b includes a deep base layer 30b thicker than other portion of the p− type base region 3b. An impurity concentration of the deep base layers 30a and 30b is higher than the other portions of the p− type base regions 3a and 3b.

By providing the deep base layers 30a and 30b, a thickness of the n− type epitaxial layer 2 under the deep base layers 30a and 30b, is reduced, and a distance between the n+ type semiconductor substrate 1 and the deep base layers 30a and 30b is reduced. Thus, electric field strength can be increased and an avalanche breakdown can easily occur.

At a predetermined region in a surface portion of the p− type base region 3a, an n+ type source region 4a is disposed. The n+ type source region 4a is shallower than the p− type base region 3a and does not overlap the deep base layer 30a. At a predetermined region in a surface portion of the p− type base region 3b, an n+ type source region 4b is disposed. The n+ type source region 4b is shallower than the p− type base region 3b and does not overlap the deep base layer 30b.

At the surface portions of the p− type base regions 3a and 3b, a surface channel layer 5 made of SiC is disposed. The surface channel layer 5 connects the n+ type source regions 4a, 4b and the n− type epitaxial layer 2. The surface channel layer 5 includes n− type layers 5a and an n+ type layer 5b. The surface channel layer 5 can function as a channel forming layer at a device surface when a device is in operation.

The n− type layers 5a are respectively disposed at the surface portions of the p− type base regions 3a and 3b. The n+ type layer 5b is disposed between the n− type layers 5a. An impurity concentration of the n− type layers 5a is lower than the impurity concentrations of the n− type epitaxial layer 2 and the p− type base regions 3a and 3b, and thereby an on-resistance is reduced. For example, the impurity concentration of the n− type layers 5a is within a range from $1 \times 10^{15}$ cm$^{-3}$ to $1 \times 10^{17}$ cm$^{-3}$.

At surface portions of the p− type base region 3a and the n+ type source region 41, a recess portion 6a is provided. At surface portions of the p− type base region 3b and the n+ type source region 4b, a recess portion 6b is provided.

On surfaces of the surface channel layer 5 and the n+ type source regions 4a and 4b, a gate insulating layer 7 made of silicon oxide is disposed. On the gate insulating layer 7, a gate electrode 8 is disposed. The gate electrode 8 is covered with an insulating layer 9 made of silicon oxide. On the insulating layer 9, a source electrode 10 is disposed. The source electrode 10 is in contact with the n+ type source regions 4a and 4b and the p− type base regions 3a and 3b. On the rear surface 1b of the n+ type semiconductor substrate 1, a drain electrode 11 is disposed. The drain electrode 11 forms an ohmic junction with the rear surface 1b of the n+ type semiconductor substrate 1.

In the n− type epitaxial layer 2, a portion between the p− type base regions 3a and 3b form a so-called junction field effect transistor (J-FET) part.

Next, a manufacturing method of the vertical power MOSFET shown in FIG. 1 will be described. Most processes of the manufacturing method of the vertical power MOSFET according to the present embodiment are similar to those of a common manufacturing method. Therefore, only processes of forming the drain electrode 11 that are different from those of the common manufacturing method will be described with reference to FIG. 2A to FIG. 2D.

In FIG. 2A to FIG. 2D, an element structure of the vertical power MOSFET is not illustrated for the sake of simplification.

First, the n+ type semiconductor substrate 1 is prepared. On the front surface side portion, of the n+ type semiconductor substrate 1, components in the vertical power MOSFET shown in FIG. 1 except the drain electrode 11 are formed.

Figure 2A:
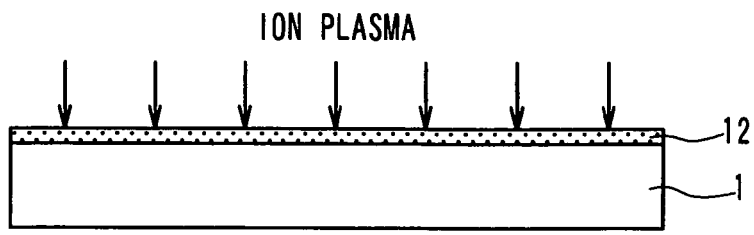
FIG. 2A to FIG. 2D are diagrams showing processes of forming a drain electrode in the vertical power MOSFET.

Then, process shown in FIG. 2A is performed. The thickness of the n+ type semiconductor substrate 1 is reduced to about 350 μm. A protective film covering the source electrode 10 is formed on the front surface side of the n+ type semiconductor substrate 1. The protective film is provided for protecting electrodes formed on the front surface side of the n+ type semiconductor substrate 1 such as the source electrode 10. The protective film is made of, for example, resin such as polyimide. The front surface side of the n+ type semiconductor substrate 1 is fixed by the protective film. Then, the drain electrode 11 is formed on the rear surface 1b of the n+ type semiconductor substrate 1 by the following processes. A surface roughness (Ra) of the rear surface 1b is set to be less than or equal to 10 nm.

Figure 2B:
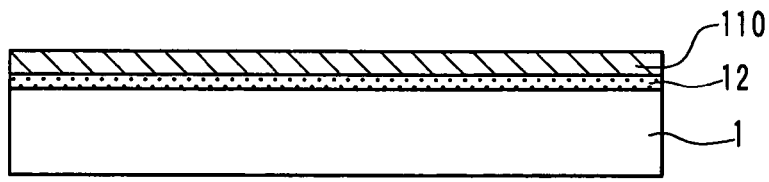
Figure 2C:
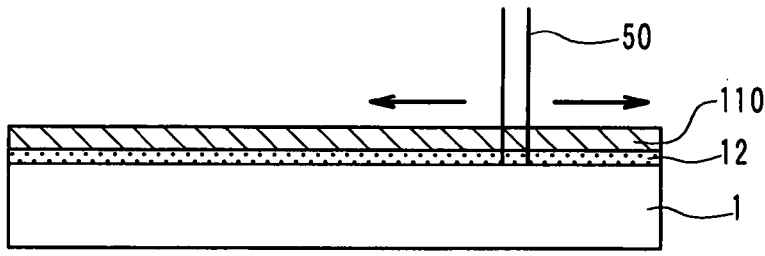
Figure 3:
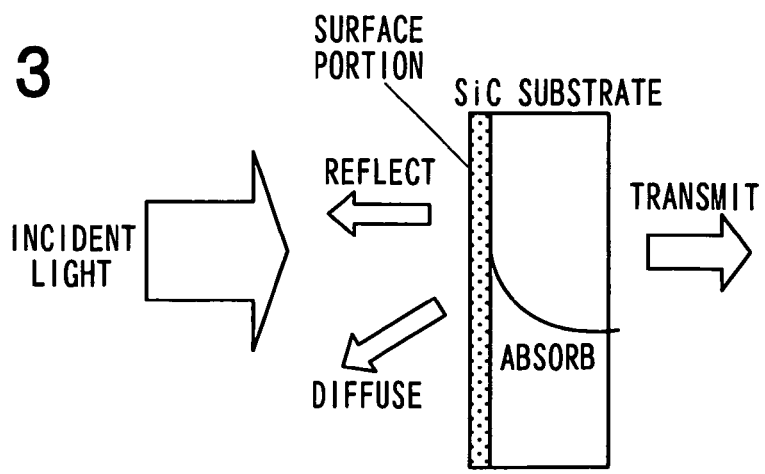
FIG. 3 is a diagram showing a relationship among an incident light, a reflected light, a diffused light, an absorbed light, and a transmitted light.

Next, the rear surface 1b of the n+ type semiconductor substrate 1 is processed so that a value of (100%-reflectance-transmittance) at a wavelength of a laser light 50 used in the following process shown in FIG. 2C is greater than or equal to 80%. The value of (100%-reflectance-transmittance) is a parameter determined based on a relationship of a reflected light and a transmitted light with respect to an incident light shown in FIG. 3. The value of (100%-reflectance-transmittance) is the difference when a reflectance, which is a ratio of the reflected light to the incident light, and a transmittance, which a ratio of the transmitted light to the incident light, are subtracted from 100%. It is considered that when an SiC substrate is irradiated with a laser light, in an incident light, a part except a transmitted light and a reflected light is absorbed in the SiC substrate or is diffused at a surface of the SiC substrate. Energy of an absorbed part in the incident light is reduced with a depth from a surface and is the highest at a surface portion of the SiC substrate. Thus, when the value of (100%-reflectance-transmittance) is larger, a larger energy is absorbed in the SiC substrate, and a laser anneal at a higher temperature can be performed.

In the present embodiment, the rear surface 1b of the n+ type semiconductor substrate 1 is processed with an ion plasma. By applying the ion plasma, the rear surface 1b of the n+ type semiconductor substrate 1 is damaged, and the value of (100%-reflectance-transmittance) becomes greater than or equal to 80% at the wavelength of the laser light 50.

During a process shown in FIG. 2B, a metal thin layer 110 is formed on the rear surface 1b of the n+ type semiconductor substrate 1. The metal thin layer 110 is formed, for example, by evaporating Ni on the rear surface 1b of the n+ type semiconductor substrate 1. A thickness of the metal thin layer 110 is determined so as to correspond to the asperity on the rear surface 1b. For example, the thickness of the metal thin layer 100 is greater than or equal to 10 nm.

Figure 2D:
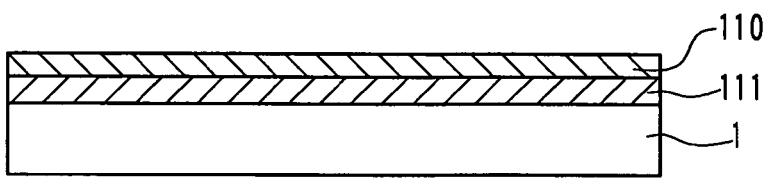

During a process shown in FIG. 2C, the metal thin layer 110 is irradiated with the laser light 50. For example, an LD excitation solid-state laser having a fundamental wavelength of 1064 nm is used, and a triple wave having a wavelength of 355 nm is generated by a wavelength conversion adapter. The rear surface 1b is scanned by the laser light 50 having a wavelength of 355 nm and only a portion where the metal thin layer 110 is formed is irradiated with the laser light 50 by a scanning or a masking. Accordingly, metal (for example, Ni in the present embodiment) in the metal thin layer 110 reacts with Si in the n+ type semiconductor substrate 1 and a silicide layer 111 shown in FIG. 2D is formed.

Through the above-described processes, the vertical power MOSFET shown in FIG. 1 is manufactured, and the drain electrode 11 including the silicide layer 111 can be formed. Thus, the drain electrode 11 can be formed as an ohmic electrode by a low-temperature process without using an impurity-doped layer.

The reason why the value of (100%-reflectance-transmittance) at the wavelength of the laser light 50 is set to be greater than or equal to 80% by the process shown in FIG. 2A will be described below.

Four SiC substrates processed by different surface treatments are prepared. A first SiC substrate is processed by a first surface treatment (ST1) in which the first SiC substrate is subject to ion plasma under conditions where a flow rate of $CF_4$ is 15 sccm, a flow rate of $O_2$ is 3 sccm, and a power is 300 W. A second SiC substrate is processed by a second surface treatment (ST2) in which the second SiC substrate is subjected to ion plasma under conditions where a flow rate of $CHF_3$ is 50 sccm, a flow rate of Ar is 50 sccm, and a power is 110 W. A third SiC substrate is processed by a third surface treatment (ST3) in which the third SiC substrate is subjected to an Ar sputtering under conditions where a flow rate of Ar is 30 sccm and a power is 110 W. A fourth SiC substrate is treated with a chemical mechanical polishing (CMP) process.

Figure 4:
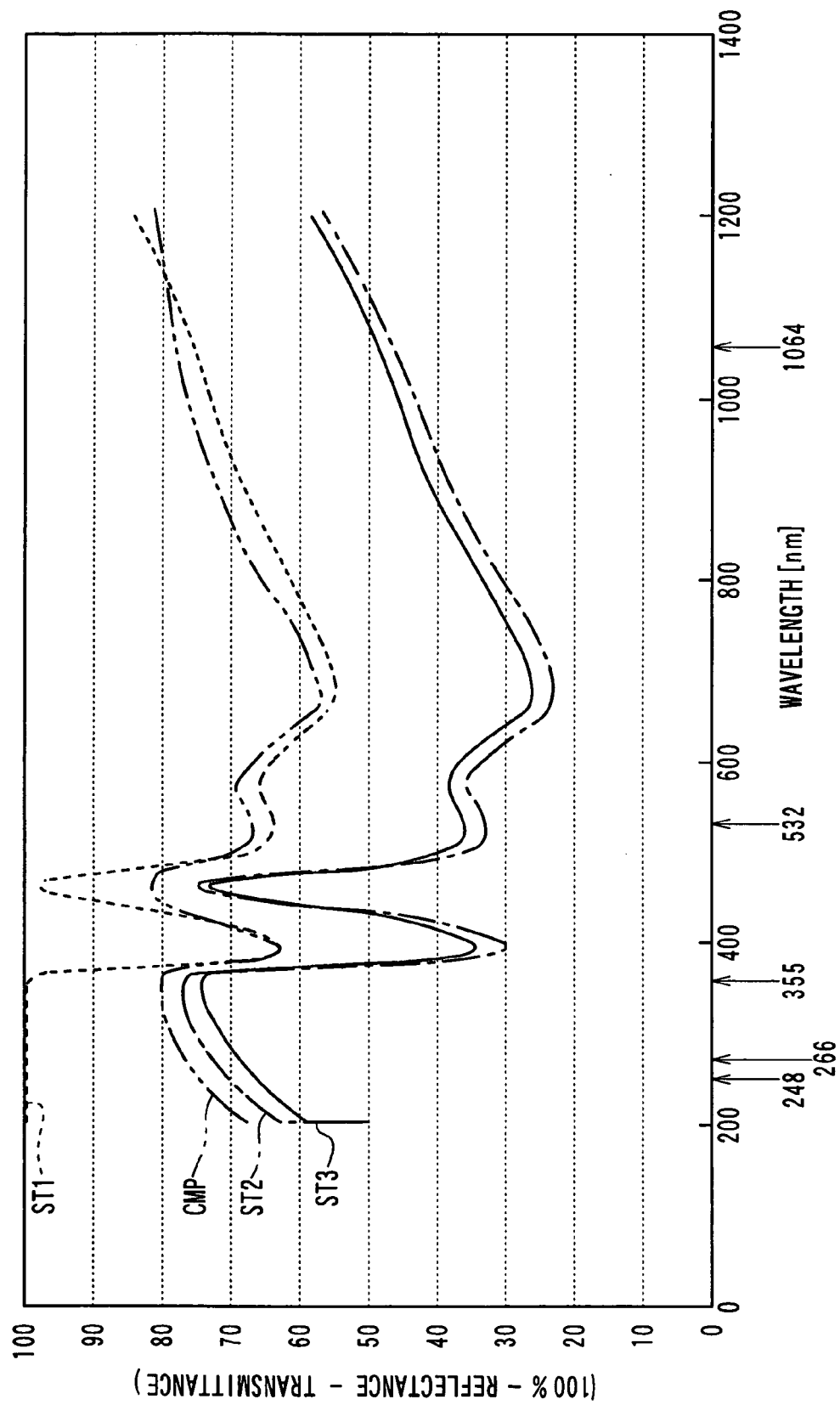
FIG. 4 is a graph showing a relationship between a wavelength and a value of (100%-reflectance-transmittance) when a rear surface of an n+ type semiconductor substrate is processed by various methods.

Surface roughnesses (Ra) of the first SiC substrate, the second SiC substrate, the third SiC substrate, and the fourth SiC substrate are 1.85 nm, 1.89 nm, 2.04 nm, and 0.56 nm, respectively. A transmittance and a reflectance of each of the SiC substrates are measured by spectrometry, and a relationship between a wavelength and the value of (100%-reflectance-transmittance) is obtained as shown in FIG. 4. Wavelengths shown with arrows under FIG. 4 are wavelengths of typical laser lights.

Figure 5:
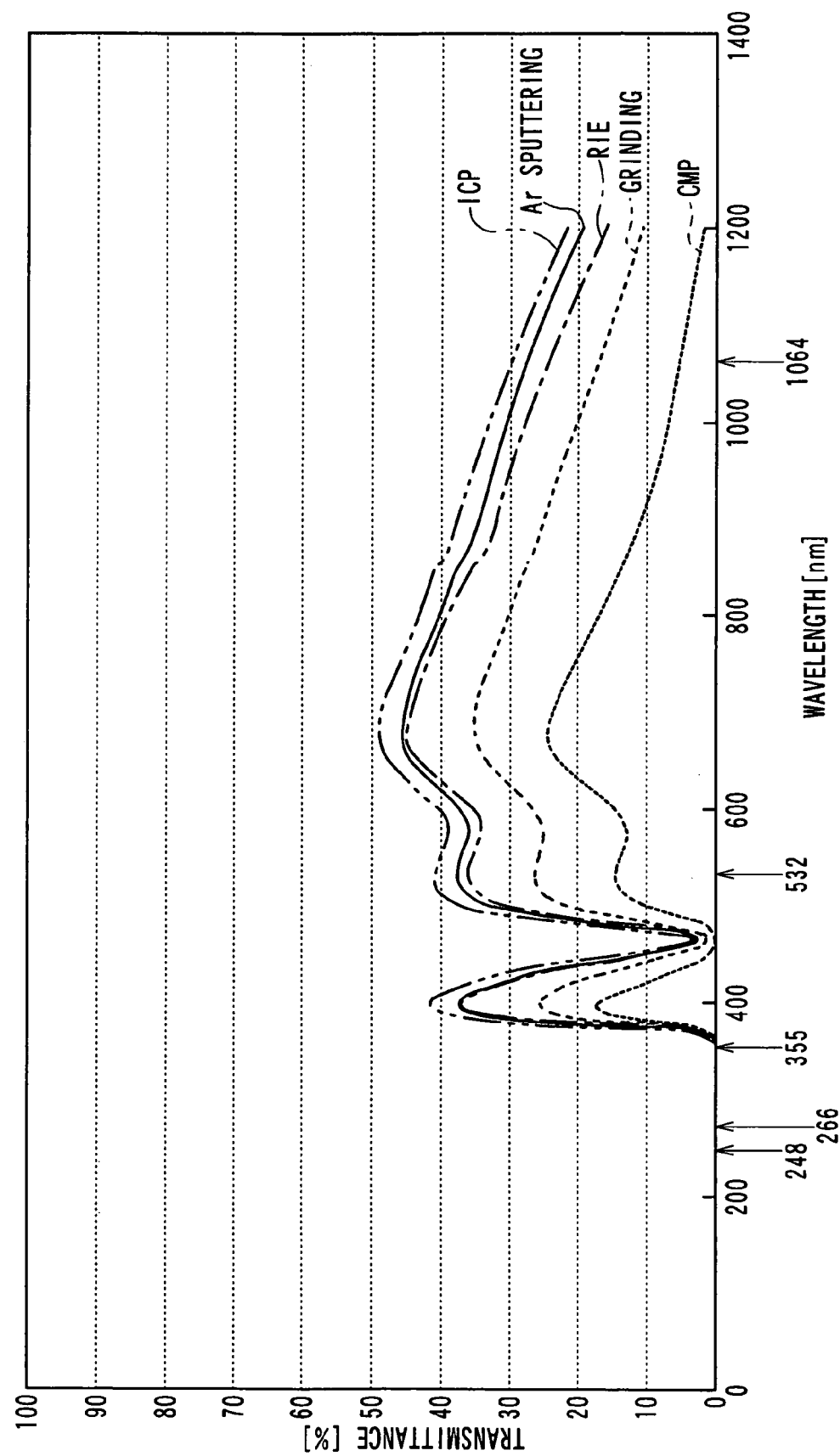
FIG. 5 is a graph showing a relationship between a wavelength and a transmittance when a metal thin layer is formed by various methods.

When the wavelength is longer than 355 nm, the SiC substrates transmit the laser light, and the value of (100%-reflectance-transmittance) is reduced as shown in FIG. 4. When the SiC transmits the laser light, the element structure on the front surface side portion may be thermally damaged. Therefore, the wavelength of the laser light 50 can be less than or equal to 355 nm. A relationship between a wavelength and a transmittance in cases where the metal thin layer 110 is formed by various methods is shown in FIG. 5. The various methods include an ion cluster plasma (ICP), an Ar sputtering, a reactive ion etching (RIE), a grinding, and a CMP. Wavelengths shown with arrows under FIG. 5 are wavelengths of typical laser lights. As shown in FIG. 5, when the wavelength of the laser light is 355 nm, the transmittance is 0%. Thus, it can be said that by setting the wavelength of the laser light to be less than or equal to 355 nm, the element structure formed on the front surface side can be restricted from being thermally damaged.

In the following example, a triple wave (355 nm) of an LD excitation solid-state laser (fundamental wavelength is 1064 nm) is used. The values of (100%-reflectance-transmittance) of the first SiC substrate, the second SiC substrate, the third SiC substrate, and the fourth SiC substrate at the wavelength of 355 nm are 99%, 77%, 74%, and 80%, respectively. The metal thin layer 110 is formed on each of the four SiC substrates, and each of the four SiC substrates is irradiated with the laser light as shown in FIG. 2C. Then, a resistance of each of the four SiC substrates is measured.

Figure 6:
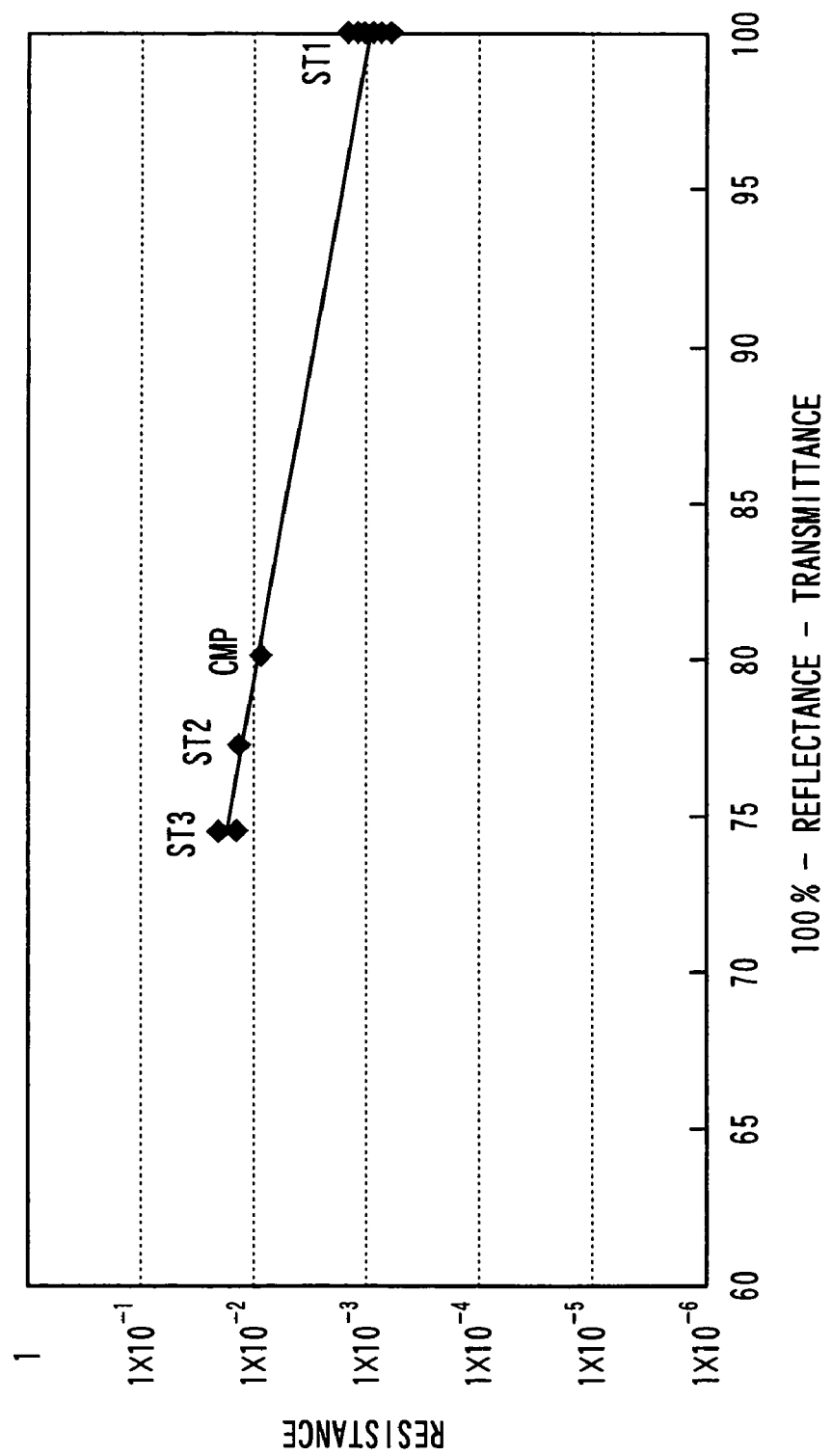
FIG. 6 is a graph showing a relationship between a value of (100%-reflectance-transmittance) at a wavelength of 355 nm and a resistance.

As shown in FIG. 6, as the value of (100%-reflectance-transmittance) becomes larger, the resistance is reduced.

When the value of (100%-reflectance-transmittance) at the wavelength of the laser light 50 is greater than or equal to 80%, an ohmic electrode having a low resistance of the order of from $10^{-3}\Omega\cdot cm^{-2}$ to $10^{-4}\Omega\cdot cm^{-2}$ can be formed. Furthermore, when the value of (100%-reflectance-transmittance) is greater than or equal to 95%, the resistance is less than or equal to about $1\times 10^{-3}$ $\Omega cm^2$.

Based on the above-described result, when the value of (100%-reflectance-transmittance) at the wavelength of the laser light 50 is set to be greater than or equal to 80%, an ohmic electrode having a low resistance can be formed. When the value of (100%-reflectance-transmittance) at the wavelength of the laser light 50 is less than 80%, a resistance of an ohmic electrode is high. Each value for determining the value of (100%-reflectance-transmittance) varies in a range of about ±10%. Therefore, each condition may be set so that the value of (100%-reflectance-transmittance) is greater than or equal to 90%. In such a case, even when a variation in each value is the maximum, the value of (100%-reflectance-transmittance) can be greater than or equal to 80% with certainty.

The conditions of the first surface treatment (ST1) is an example of processing the rear surface 1b of the n+ type semiconductor substrate 1 so that the value of (100%-reflectance-transmittance) is greater than or equal to 80%. Even when a surface treatment is performed under other conditions, the value of (100%-reflectance-transmittance) can be greater than or equal to 80%.

For example, when $CF_4$ and $O_2$ are used as introduced gas in a surface treatment with ion plasma, a flow rate of $CF_4$ can be from 10 sccm to 15 sccm, a flow rate of $O_2$ can be from 2 sccm to 3 sccm, and a power can be from 250 W to 400 W. When $SF_6$ is used instead of $CF_4$ and $O_2$, a flow rate of $SF_6$ can be 0 sccm to 8 sccm (not including 0 sccm) and a power can be from 250 W to 400 W. When $CHF_3$ and Ar are used, a flow rate of $CHF_3$ can be 30 sccm to 50 sccm, a flow rate of Ar can be 50 sccm to 70 sccm, and a power can be from 100 W to 200 W. In the above-described case, $CF_4$ can also be used instead of $CHF_3$, and a flow rate of $CF_4$ can be from 0 sccm to 10 sccm (not including 0 sccm), a flow rate of Ar can be from 50 sccm to 70 sccm, and a power can be 100 W to 200 W. In a surface treatment with an Ar sputtering, a flow rate of Ar can be 10 sccm to 50 sccm and a power can be from 100 W to 500 W.

Based on the above-described study, the value of (100%-reflectance-transmittance) at the wavelength of the laser light 50 is set to be greater than or equal to 80%. Furthermore, when the value of (100%-reflectance-transmittance) at the wavelength of the laser light 50 is greater than or equal to 95%, an ohmic junction having a lower resistance can be obtained.

Even after the drain electrode 11 is formed on the rear surface 1b of the n+ type semiconductor substrate 1 by the above-described method, electric characteristics of the elements form on the front surface side portion do not change. Thus, an ohmic electrode (drain electrode 11) can be formed on the rear surface 1b of the n+ type semiconductor substrate 1 without thermally damaging the front surface side portion of the n+ type semiconductor substrate 1 whose thickness is reduced.

As described above, in the manufacturing method according to the present embodiment, after the element structure and the front surface electrode are formed on the front surface side of the n+ type semiconductor substrate 1, the rear surface 1b of the n+ type semiconductor substrate 1 is processed so that the value of (100%-reflectance-transmittance) at the wavelength of the laser light 50 is greater than or equal to 80%. Then, the metal thin layer 110 is formed on the processed rear surface 1b, and the rear surface side of the n+ type semiconductor substrate 1 is irradiated with the laser light 50, and thereby the drain electrode 11 including the silicide layer 111 is formed.

Thus, the drain electrode 11 including the silicide layer 111 can be formed without a high-temperature heat treatment. In other words, the drain electrode 11 can form an ohmic junction with the rear surface 1b without thermally damaging the element structure formed in the front surface side portion of the n+ type semiconductor substrate 1. Therefore, the drain electrode 11 can be, formed as an ohmic electrode by a low-temperature process without using an impurity-doped layer and a polishing process.

Second Embodiment

A manufacturing method according to a second embodiment of the present invention will be described below. In the present embodiment, the laser light 50 use for forming the silicide layer 111 is changed from that of the manufacturing method according to the first embodiment. The other parts of the manufacturing process may be similar to those of the manufacturing method according to the first embodiment.

In the manufacturing method according to the first embodiment, the LD excitation solid-state laser is used as the laser light 50. In the present embodiment, KrF excimer laser having a wavelength of 248 nm is used as the laser light 50. The rear surface side of the n+ type semiconductor substrate 1 is irradiated with the KrF excimer laser having an intensity of, for example, 1300 $mJ/cm^2$, and thereby the silicide layer 111 is formed in drain electrode 11. Also in this method, an ohmic electrode having a resistance less than or equal to $10^{-3}$ $\Omega\cdot cm^{-2}$ can be formed.

Other Embodiments

Although the present invention has been fully described in connection with the preferred embodiments thereof with reference to the accompanying drawings, it is to be noted that various changes and modifications will become apparent to those skilled in the art.

In the above-described embodiments, the power MOSFET is formed in the n+ type semiconductor substrate 1, as an example. Other element structure such as a diode and an insulated gate bipolar transistor (IGBT) may also be formed in the n+ type semiconductor substrate 1.

During the process shown in FIG. 2A, the ion plasma is used as a method for processing the rear surface 1b of the n+ type semiconductor substrate 1 so that the value of (100%-reflectance-transmittance) at the wavelength of the laser light 50 is greater than or equal to 80%, as an example. In addition to a sputtering such as an ion plasma and an Ar sputtering, a laser abrasion, an ion cluster plasma (ICP), an etching may also be used. Even when the above-described methods such as the laser abrasion are used for the processing the rear surface 1b of the n+ type semiconductor substrate 1 during the process shown in FIG. 2A and the drain electrode 11 can be formed through the processes shown in FIG. 2B to FIG. 2D, an ohmic junction having a low resistance can be formed.

For example, when the laser abrasion is used, a wavelength can be less than or equal to 355 nm and an output intensity can be set in a range from 800 $mJ/cm^2$ to 2000 $mJ/cm^2$. When the ICP is used, for example, $CHF_3$ and Ar can be used, a flow rate of $CHF_3$ can be from 30 sccm to 50 sccm, a flow rate of Ar can be 50 sccm to 70 sccm, and a power can be from 100 W to 200 W. When $CF_4$ is used instead of $CHF_3$, a flow rate of $CF_4$ can be 0 sccm to 10 sccm (not including 0 sccm), a flow rate of Ar can be from 50 sccm to 70 sccm, and a power can be from 100

W to 200 W. When a reactive ion etching (RIE) is used, a flow rate of $CF_4$ can be from 10 sccm to 15 sccm, a flow rate of $O_2$ can be from 2 sccm to 3 sccm, and a power can be from 250 W to 400 W. When $SF_6$ is used instead of $CF_4$ and $O_2$, a flow rate of $SF_6$ can be from 0 sccm to 8 sccm (not including 0 sccm) and a power can be from 250 W to 400 W.

During the process shown in FIG. 2B, the metal thin layer 110 is formed by the evaporation as an example. The metal thin layer 110 may also be formed by a chemical vapor deposition, an application, a coating, or an electroplating.

During the process shown in FIG. 2C, the LD excitation solid-state laser is used as an example of the laser light 50. Other laser such as a semiconductor laser, a YAG laser, and gas laser can also be used.

As a material of the metal thin layer 110, in addition to Ni, other metal such as Ti, Mo, W, and Ta that forms a silicide or a carbide can also be used. For example, when the metal thin layer 110 is formed of Ti and the drain electrode 11 is formed through the processes shown in FIG. 2A to FIG. 2D, a generation of Ti silicide can be confirmed by an Augier analysis. In this way, when the metal thin layer 110 is formed of metal that can form a silicide layer or a carbide layer, the resistance of the drain electrode 11 can be reduced.

In the above-described embodiments, the surface treatment of the rear surface 1b of the n+ type semiconductor substrate 1 is performed before forming the metal thin layer 110. Alternatively, after the metal thin layer 110 is formed, a surface of the metal thin layer 110 may be processed so that the value of (100%-reflectance-transmittance) at the wavelength of the laser light 50 is greater than or equal to 80%. The surface of the metal thin layer 110 may be processed, for example, by an ion plasma, an etching, or a laser abrasion.

For example, when ion plasma or RIE is used, a flow rate of $CF_4$ can be from 10 sccm to 15 sccm, a flow rate of $O_2$ can be from 2 sccm to 3 sccm, and a power can be from 250 W to 400 W. When $SF_6$ is used instead of $CF_4$ and $O_2$, a flow rate of $SF_6$ can be from 0 sccm to 8 sccm (not including 0 sccm) and a power can be from 250 W to 400 W. When the laser abrasion is used, a wavelength can be less than or equal to 355 nm and an output intensity can be from 800 $mJ/cm^2$ to 2000 $mJ/cm^2$.

What is claimed is:

1. A method of manufacturing a silicon carbide semiconductor device that includes a semiconductor substrate and an electrode, the semiconductor substrate made of silicon carbide and having a first surface and a second surface opposing the first surface, the electrode formed on the second surface of the semiconductor substrate and being an ohmic electrode, the method comprising:

preparing the semiconductor substrate and processing the second surface of the semiconductor substrate so that a surface roughness of the second surface is less than or equal to 10 nm and a value of (100%-reflectance-transmittance) at a wavelength of a laser light is greater than or equal to 80%;

forming a metal layer on the second surface of the semiconductor substrate after the processing the second surface; and forming the electrode by irradiating the metal layer with the laser light.

2. The method according to claim 1, wherein
the processing the second surface includes processing a surface portion of the semiconductor substrate adjacent to the second surface by one of an ion plasma, a sputtering, a laser abrasion, an ion cluster plasma, and an etching.

3. The method according to claim 1, wherein
the forming the metal layer includes forming the metal layer that includes at least one of Ni, Ti, Mo, W, and Ta.

4. The method according to claim 1, wherein
the forming the metal layer includes forming the metal layer that has a thickness of greater than or equal to 10 nm.

5. The method according to claim 1, wherein
the forming the electrode includes irradiating only the metal layer on the second surface with the laser light by one of a scanning and a masking.

6. The method according to claim 1, wherein
the forming the electrode includes irradiating the metal layer with the laser light that has the wavelength less than or equal to 355 nm.

7. The method according to claim 1, wherein
the preparing the semiconductor substrate includes forming an element structure in a first surface side portion of the semiconductor substrate adjacent to the first surface and, forming another electrode on the first surface of the semiconductor substrate, and
the electrode, the element structure, and the another electrode configurate a vertical semiconductor device in which an electric current flows between the electrode and the another electrode.

* * * * *